(12) United States Patent  
LopezGarcia et al.

(10) Patent No.: US 9,292,633 B2  
(45) Date of Patent: Mar. 22, 2016

(54) METHOD AND SYSTEM OF DISPLAYING A GRAPHICAL REPRESENTATION OF HYDROCARBON PRODUCTION PARAMETERS

(71) Applicant: LANDMARK GRAPHICS CORPORATION, Houston, TX (US)

(72) Inventors: Carlos M. LopezGarcia, Katy, TX (US); Giuseppe Moricca, Codogno (IT); Gustavo A. Carvajal, Houston, TX (US); Miguel A. Villamizar, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/113,511

(22) PCT Filed: Mar. 13, 2013

(86) PCT No.: PCT/US2013/030973  
§ 371 (c)(1),  
(2) Date: Oct. 23, 2013

(87) PCT Pub. No.: WO2013/172946  
PCT Pub. Date: Nov. 21, 2013

(65) Prior Publication Data  
US 2014/0074447 A1 Mar. 13, 2014

Related U.S. Application Data

(60) Provisional application No. 61/646,413, filed on May 14, 2012.

(51) Int. Cl.  
*G06F 17/50* (2006.01)  
*E21B 43/30* (2006.01)

(52) U.S. Cl.  
CPC ........... *G06F 17/5009* (2013.01); *E21B 43/30* (2013.01)

(58) Field of Classification Search  
None  
See application file for complete search history.

(56) References Cited

U.S. PATENT DOCUMENTS

| | | | | |
|---|---|---|---|---|
| 6,927,772 | B2 * | 8/2005 | Page | 345/440 |
| 7,059,180 | B2 * | 6/2006 | Al-Ghamdi | 73/152.42 |
| 7,676,326 | B2 | 3/2010 | Podladchikov et al. | |
| 2005/0155759 | A1 | 7/2005 | Bramlett et al. | |
| 2008/0234939 | A1 * | 9/2008 | Foot et al. | 702/12 |
| 2009/0151933 | A1 | 6/2009 | Suter et al. | |

(Continued)

OTHER PUBLICATIONS

Petrosys, "Bubble Maps", Published online on 2009 and downloadable at http://www.petrosysguru.com/newsletters/previous/200602/10141_Bubble_Maps.htm, 4 pages.*

Petrosys, "Exploring with Bubble Maps", downloadable at http://www.petrosys.com.au/assets/newsletter_edition_2.pdf, Feb. 2006, 4 pages.*

(Continued)

*Primary Examiner* — Omar Fernandez Rivas  
*Assistant Examiner* — Herng-Der Day (57) ABSTRACT

Displaying a graphical representation of hydrocarbon production parameters. At least some of the various embodiments are methods including: reading historical values of a production parameter of a hydrocarbon well; calculating a plurality of deviation values with respect to a respective plurality of planned values regarding the production parameter; displaying, on a display device of a computer system, an overhead view of a location of the hydrocarbon well within a hydrocarbon field; and displaying, on the display device proximate the location, a graphical image that depicts each of the plurality of deviation values.

25 Claims, 6 Drawing Sheets

(56) References Cited

U.S. PATENT DOCUMENTS

2010/0307755 A1   12/2010  Xu et al.
2012/0022791 A1    1/2012  Podladchikov et al.
2012/0191432 A1*  7/2012  Khataniar et al. .............. 703/10

OTHER PUBLICATIONS

International Search Report and Written Opinion; PCT/US2013/030973 mailed Jun. 13, 2013.

* cited by examiner

METHOD AND SYSTEM OF DISPLAYING A GRAPHICAL REPRESENTATION OF HYDROCARBON PRODUCTION PARAMETERS

BACKGROUND

In the realm of hydrocarbon production, a reservoir or production engineer may be assigned responsibility for monitoring production of a hydrocarbon field comprising many hydrocarbon wells. In many cases, the production from any one hydrocarbon well is not a standalone consideration, as efficient drainage of the underlying hydrocarbon reservoir is based on the production flows from each hydrocarbon well. Thus, each hydrocarbon well may have a planned or expected production, and deviations from the planned production for any one hydrocarbon well may adversely affect the efficiency of the drainage of the underlying hydrocarbon reservoir.

Deviations from planned production may be significantly different over different periods of time for a single hydrocarbon well. For example, a hydrocarbon well may be below planned production when considered over a year, but ahead of the daily planned production or monthly planned production. Moreover, when considering deviations from planned production over multiple different periods of time for each of the many hydrocarbon wells in a hydrocarbon field, it may be difficult for the reservoir or production engineer to visualize all the information and to distinguish patterns in the deviations.

BRIEF DESCRIPTION OF THE DRAWINGS

For a detailed description of exemplary embodiments, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Real-time" in reference to an action (e.g., plotting deviation values) shall mean the action takes places within one minute or less of a trigger event for the action. "Real-time" in reference to data shall mean that the data were created, read, or updated within one minute or less.

DETAILED DESCRIPTION

The following discussion is directed to various embodiments of the invention. Although one or more of these embodiments may be preferred, the embodiments disclosed should not be interpreted, or otherwise used, as limiting the scope of the disclosure or claims. In addition, one skilled in the art will understand that the following description has broad application, and the discussion of any embodiment is meant only to be exemplary of that embodiment, and not intended to intimate that the scope of the disclosure or claims is limited to that embodiment.

At least some of the various embodiments are directed to methods and systems of visualizing production deviations for hydrocarbon wells in a field of hydrocarbon wells. More particularly, at least some embodiments are directed to a computer-implemented methodology for calculating and visualizing production deviations over multiple periods of time for each well such that a reservoir engineer or production engineer may determine patterns in the deviations. The specification first turns to an illustrative hydrocarbon producing field to orient the reader to the physical structure at issue, and then to various embodiments of visualizing the deviations.

Figure 1:
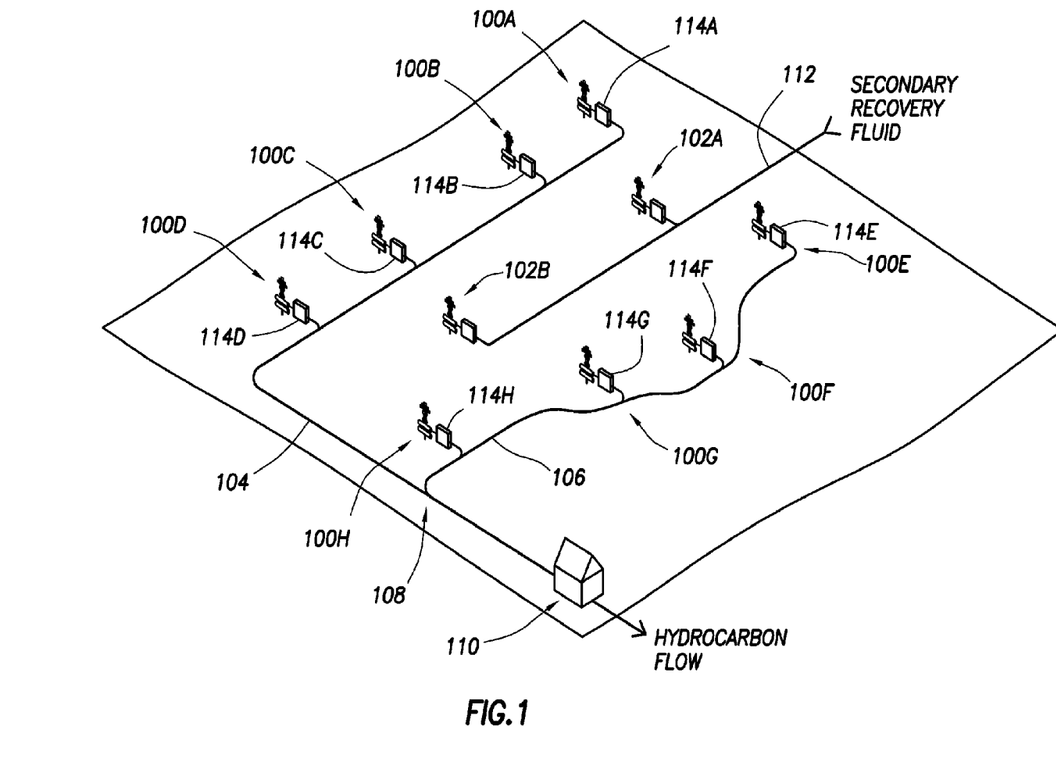
FIG. 1 shows a perspective view of a hydrocarbon producing field in accordance with at least some embodiments.

FIG. 1 shows a perspective view of a hydrocarbon producing field in accordance with at least some embodiments. In particular, the hydrocarbon producing field comprises a plurality of wellbores. Some wellbores are wellbores out which hydrocarbons flow (i.e., hydrocarbon wells), and other wellbores are used for injection of secondary recovery fluids, such as water or compressed carbon dioxide (i.e., injection wells). In the illustrative case of FIG. 1, wellbores 100 (labeled 100A through 100H) are hydrocarbon wells, and wellbores 102 (labeled 102A and 102B) are injection wells. The location of each wellbore is symbolized in the FIG. 1 by a valve stack, sometimes referred to as a "Christmas tree" in the industry, based primarily on its shape. The location of each wellbore may seem random when viewed from above, but in most cases has a layout to increase the extraction of hydrocarbons from the underlying formation (not shown).

In order to gather the produced hydrocarbons for sale, the hydrocarbon field has one or more production flow lines (sometimes "production line"). In FIG. 1, production line 104 gathers hydrocarbons from illustrative hydrocarbon wells 100A-100D, and production line 106 gathers hydrocarbons from illustrative hydrocarbon wells 100E-100G. The production lines 104 and 106 tie together at point 108, and then flow to a metering facility 110.

In some cases, the secondary recovery fluid is delivered to the injection wells by way of trucks, and thus the secondary recovery fluid may only be pumped into the formation on a periodic basis (e.g., daily, weekly). In other embodiments, and as illustrated, the secondary recovery fluid is provided under pressure to the injection wells 102A and 102B by way of pipes 112.

The hydrocarbon producing field of FIG. 1 illustratively has eight hydrocarbon wells, and two injection wells; however, the number of wells is merely illustrative. In practice, a hydrocarbon producing field may have many tens or even hundreds of wellbores. The illustration of FIG. 1 is presented with a limited number of wellbores so as not to unduly complicate the figure and the discussion, but such should not be read as a limitation as to the applicability of the various embodiments.

In accordance with at least some embodiments, each hydrocarbon well 100 has at least one, and in some cases more than one, measurement device for measuring parameters associated with the hydrocarbon production. FIG. 1 illustrates the measurement devices as devices 114A-114H associated one each with each hydrocarbon well 100A-100H, respectively. The measurement devices may take many forms, and the measurement devices need not be the same across all the hydrocarbon wells 100. In some cases, the measurement device may be related to the type of lift employed (e.g., electric submersible, gas lift, pump jack). In other cases, the measurement device may be selected based on a particular quality of hydrocarbons produced, such as a tendency to produce excess water. With the idea in mind that many variations on the selection of measurement devices are possible, even for similarly situated wells, the specification now turns to an example list of such devices.

In some cases, one or more of the measurement devices 114 may be a multi-phase flow meter. A multi-phase flow meter has the ability to not only measured hydrocarbon flow from a volume standpoint, but also give an indication of the mixture of oil and gas in the flow. One or more of the measurement devices may be oil flow meters, having the ability to discern oil flow, but not necessarily natural gas flow. One or more of the measurement devices may be natural gas flow meters. One or more of the measurement devices may be water flow meters. One or more of the measurement devices may be pressure transmitters measuring the pressure at any suitable location, such as at the wellhead, or within the borehole near the perforations. In the case of measurement devices associated with the lift provided, the measurement devices may be voltage measurement devices, electrical current measurement devices, pressure transmitters measuring gas lift pressure, frequency meters for measuring frequency of applied voltage to electric submersible motor coupled to a pump, and the like. Moreover, multiple measurement devices may be present on any one hydrocarbon producing well. For example, a well where artificial lift is provided by an electric submersible may have various devices for measuring hydrocarbon flow at the surface, and also various devices for measuring performance of the submersible motor and/or pump. As another example, a well where artificial lift is provided by a gas lift system may have various devices for measuring hydrocarbon flow at the surface, and also various measurement devices for measuring performance of the gas lift system.

Figure 2:
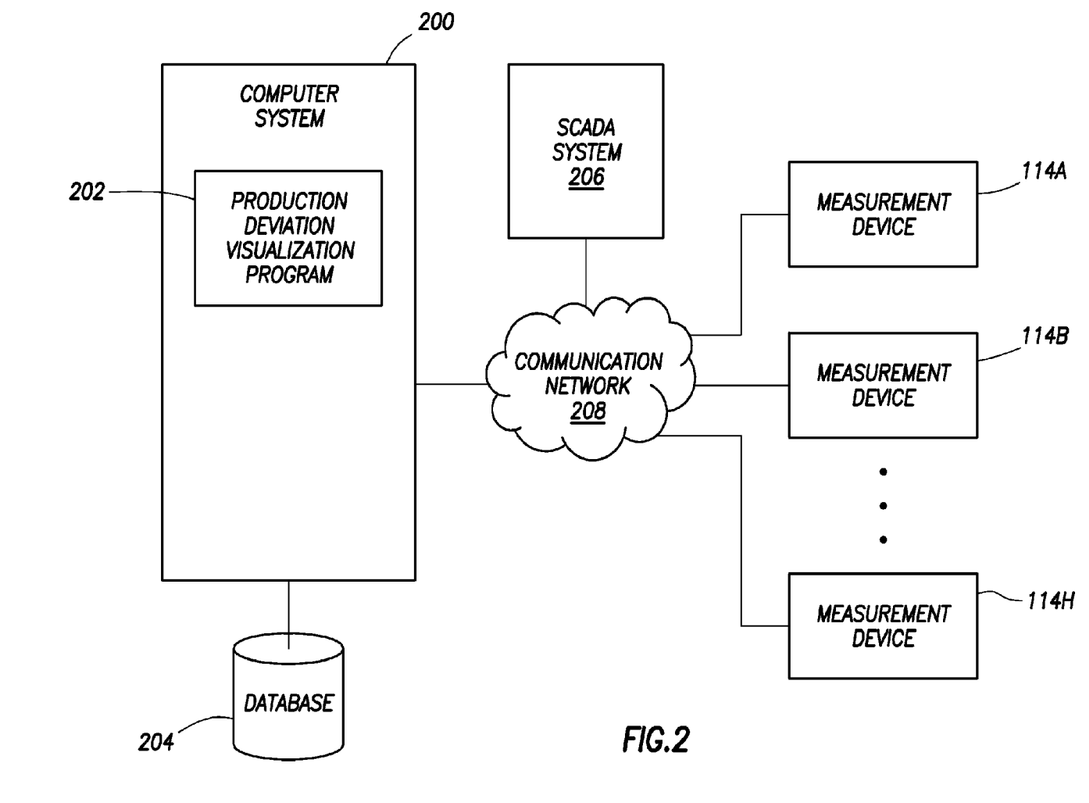
FIG. 2 shows a block diagram of a system in accordance with at least some embodiments.

FIG. 2 shows a block diagram of system in accordance with at least some embodiments. In particular, the system comprises a computer system 200 upon which one or more programs are executed. The computer system may take any suitable form. In some cases, the computer system 200 is a server system located at a data center associated with the hydrocarbon producing field. The data center may be physically located on or near the field, or the data center may be many hundreds or thousand of miles from the hydrocarbon producing field. In other cases, computer system 200 may be a laptop or desktop computer system. In yet still other cases, the computer system 200 may be a conglomeration of computer devices, such as portable devices communicatively coupled to other computer systems. Further still, the computer system 200 may be "cloud" computer systems, such that the precise location of the computer systems is not known to the user, or may change based on the computer load presented.

Regardless of the precise nature of the computer system 200, the computer system executes one or more programs that gather real time and/or historical data regarding hydrocarbon production, calculate deviations from planned values, and display the information on the display device of a computer system. The one or more programs are illustrated as production deviation visualization program 202. More particularly, the production deviation visualization program 202 may, for each hydrocarbon well in the hydrocarbon field, calculate a plurality of deviation values (e.g., daily, monthly, and yearly), and for each well in the field (or particular subsets of the wells) display an overhead view of the physical location of each hydrocarbon well in the field, and also display a graphical image that depicts each of the plurality of deviation values. Various example calculations of deviation values are discussed more below.

Production deviation visualization program 202 calculates the deviations based on a variety of data. For example, to calculate the deviations of the production parameter over a predetermined period of time, the data upon which the calculations are made include historical data, such as data stored in a database 204 coupled to the computer system 200. In some embodiments, deviations of the production parameters may be based on current or real-time data associated with hydrocarbon production, such as current hydrocarbon flow. The real-time data may be read from a supervisory control and data acquisition (SCADA) system 206 (which SCADA system itself may implement a database of historical values), coupled to the computer system 200 by way of a communication network 208. In other cases, the data upon which deviations are calculated may come directly to the computer system 200 from the measurement devices 114 themselves, coupled to the computer system 200 by way of the communication network 208.

The communication network 208 may take any suitable form. In some cases, the communication network 208 is a dedicated local- or wide-area network to which the various devices are coupled. In other cases, the communication network may involve in whole or in part the Internet, such as a virtual private network (VPN) carried over the Internet. From a hardware stand point the communication network may involve electrical conductors, optical conductors, ground-based radio frequency electromagnetic wave signals propagated point-to-point, and/or satellite based communication. Regardless of the type of communication network used, the computer system communicates with one or more devices to obtain data for calculating deviations from planned hydrocarbon production.

Figure 3:
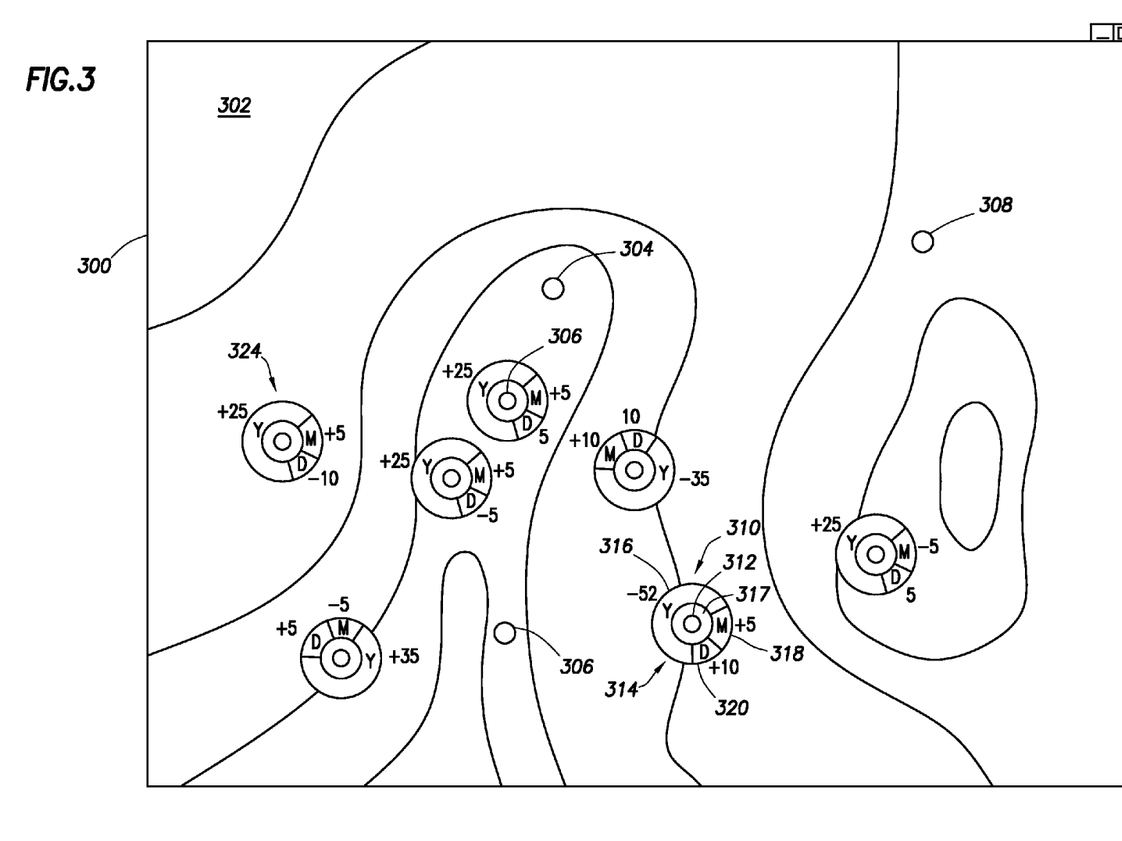
FIG. 3 shows a user interface in accordance with at least some embodiments.

The specification now turns to an example visualization of the deviation of the production parameters. FIG. 3 shows a user interface in accordance with at least some embodiments, which user interface may be rendered on a display device of a computer system. In particular, user interface 300 comprises a pane 302 that shows an overhead view of at least a portion of the hydrocarbon field, and thus shows some or all of the hydrocarbon wells in the field. In the illustration of FIG. 3, the relative horizontal location of each well is shown by a small circle, such as wells 304, 306, and 308. In some cases the overhead view may be an actual high altitude picture of the field (e.g., taken by airplane, or taken by satellite), with graphics embedded thereon showing the relative location of each well. In other cases, and as illustrated, the overhead view may be a topographical map, again with graphics embedded thereon showing the relative location of each hydrocarbon well. In yet still further cases, the view in the pane 302 may merely show the relative horizontal location of each hydrocarbon well. Other arrangements are possible.

In accordance with these embodiments, a reservoir or production engineer uses the user interface 300 to visualize the deviations regarding planned production parameters for some or all of the hydrocarbon wells in the field. As illustrated, seven wells are associated with a graphical image that depicts deviations of the production parameters, and three wells (wells 304, 306, and 308) have no graphic associated therewith. Wells without a graphical image may be hydrocarbon wells that are shut in, injection wells, or non-selected wells. For example, the production engineer may wish to view the deviations of production parameters of just natural flowing wells, and thus elect not to show a graphical image regarding production parameters for hydrocarbon wells with other types of lift (e.g., electric submersible lift, gas lift).

Each graphical image shows one or more deviation values with respect to one or more planned values regarding production parameters. The specification will focus on graphical image 310 as illustrative, and will further assume that the production parameter of interest is oil production. In particular, illustrative graphical image 310 fully encloses the indicia of location of the hydrocarbon well 312 (again in this illustrative case the indicia of location being a circle). The illustrative graphical image 310 comprises an annulus 314 that fully encloses the indicia of location, but other shapes may be used. Stated otherwise, the location of the hydrocarbon well may reside in the aperture 317 of the annulus 314.

The graphical image 310 is logically divided into portions, with each portion depicting a particular deviation value. In the example case of three deviation values of interest (e.g., yearly oil production deviation, monthly oil production deviation, and daily oil production deviation), the illustrative annulus 314 may have three distinct portions with each portion associated with a particular deviation value. In particular, a yearly portion 316 may be associated with the yearly deviation value, a monthly portion 318 may be associated with a monthly deviation value, and a daily portion 320 may be associated with daily deviation value. In the illustrative case of FIG. 3, the portions are separated by radially extending lines, but in other cases any form of delineation may be used, such as changes in color, or small gaps in the annulus 314.

In some embodiments, each portion of the annulus has a predetermined circumferential length. In the illustrative case of FIG. 3, the yearly portion 316 spans half or more of the circumferential length, and as illustrated about two-thirds of the circumferential length. The illustrative monthly portion 318 spans less than half the circumferential length, and as illustrated about half of the remaining one-third (i.e., about one-sixth of the circumferential length). The illustrative daily portion 320 spans less than half the circumferential length, and as illustrated about half of the remaining one-third (i.e., about one-sixth of the circumferential length). Other circumferential lengths may be used, such as about one-half the circumferential length for the yearly portion, and about one-quarter each for the daily and monthly portions. In accordance with at least some embodiments the circumferential length of each portion is unrelated to the deviation value depicted. For example, for the graphical image 310 the yearly deviation is shown as 52 units below the planned value (shown in part by the "−52" to the left of the "Y" in the yearly portion 316), and for graphical image 324 the yearly deviation is shown as 25 units above the planned value (shown in part by the "+25" to the left of the "Y"), yet in each case the circumferential length of the portions is about the same.

In accordance with at least some embodiments, each graphical image may depict the status of each deviation value as above a planned value, below a planned value, or at the planned value (within a predetermined window of values, as the actual production parameters will rarely fall precisely on the planned value). Considering just above and below the planned values, in some embodiments the delineation may be by way of a color. That is, in some embodiments if the deviation value is below the planned value for the time period of interest, the status as below the planned value may be visually depicted as a color rendered within the portion of the annulus. In the example of FIG. 3 for hydrocarbon well 312, the yearly deviation value is below the planned value by 52 units, and in this case the yearly portion 316 may have color rendered therein to depict the status of the deviation value as below planned, such as by rendering red within the yearly portion 316. In the example of FIG. 3 for hydrocarbon well 312, the daily deviation value is above the planned value by 10 units, and in this case the daily portion 320 may have color rendered therein to depict the status of the deviation value as above planned, such as by rendering green within the daily portion 320. Likewise, for illustrative hydrocarbon well 312 the monthly deviation value is above the planned value by 5 units, and in this case the monthly portion 320 may have green color rendered therein to depict the status of as above planned.

In a particular embodiment, the rendering of color to depict status as above or below planned may be Boolean in the sense that a particular red is used for a deviation value below planned regardless of the magnitude of the deviation, and a particular green is used for a deviation value above planned regardless of the magnitude of the deviation. In other embodiments, some aspect of the color may change based on the magnitude of the deviation. For example, as the magnitude of the deviation values increases further below the planned values, the red color indicating below may change hue, or the brightness may increase with greater magnitudes of deviation.

Figure 4:
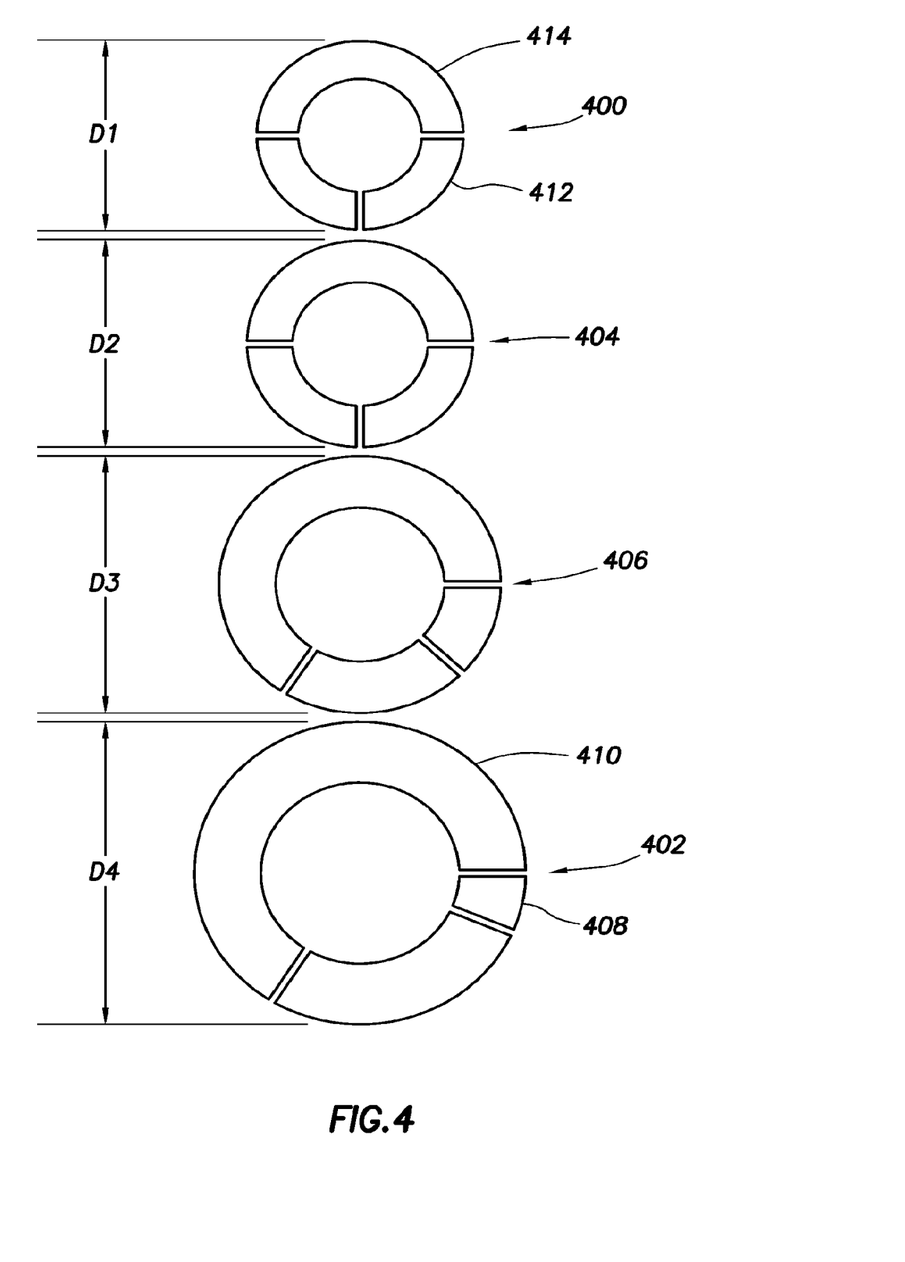
FIG. 4 shows an example set of illustrative graphical images having varying diameters, and with varying size portions that make up the graphical image, in accordance with at least some embodiments.

In some embodiments, the diameter of the annulus is proportional to the one of the deviation values. For example, in some embodiments the yearly deviation sets or controls the diameter of the annulus rendered. FIG. 4 shows a set of four annuli having different diameters. In the illustrative case of the diameter set or controlled by the yearly deviation value, the diameter illustrated by annulus 400 has the smallest diameter $D1$, and in the illustrative case of oil flow the smallest diameter may be associated with deviations values from 0.1 to 5.0 thousand standard barrels (kSTB). The diameter illustrated by annulus 402 has the largest diameter $D4$, and in the illustrative case of oil flow the largest diameter may be associated with deviations values above 25.1 kSTB. For yearly oil flow deviation values between 5.1 kSTB and 25.0 kSTB, two illustrative diameters are shown: annulus 404 having diameter $D2$ (for deviation range 5.1 to 15 kSTB); and annulus 406 having diameter $D3$ (for deviation range 15.1 to 25.0 kSTB).

Having four different diameters of annuli for expected deviation is merely illustrative. In some cases, the diameters of the annuli may be the same regardless of deviation. In other cases, the set of diameters may comprise only two, or only three different diameters, with the deviation ranges adjusted accordingly. Yet further still, any of the yearly, monthly, and/or daily deviations may be used as the basis for selecting a particular diameter of each annulus.

In some cases, the circumferential length of each portion of the annulus is fixed, and thus regardless of the magnitude of the deviation value, the circumferential length remains unchanged. However, in other embodiments the circumferential length of each portion of the annulus is proportional to the magnitude of the respective deviation. Still referring to FIG. 4, in addition to illustrating different diameters for each annulus, the annuli also illustrates changes in circumferential length proportional to the magnitude of the deviation value.

For example, annulus 402 illustrates a situation where the magnitude of the daily deviation value is relatively small (portion 408), but the magnitude of the yearly deviation value is relatively large (portion 410). By contrast, annulus 400 illustrates a situation where the magnitude of the daily deviation is relatively large (portion 412), but the yearly deviation (portion 414) is relatively small.

The discussion of the yearly deviation values to this point has been based oil production; however, the illustrative annuli may be used for any production parameter for which planned values are established and compared against actual production. For example, each annulus may show a yearly, monthly, and daily deviation for natural gas production. Each annulus may show a yearly, monthly, and daily deviation for combined oil and natural gas production. Each annulus may show a yearly, monthly, and daily deviation for water production. In many cases each annulus displayed will be based on the same underlying production parameter (e.g., each annulus showing deviation of oil production, or each annulus showing deviations of water production), but in other cases the user may adjust properties of the production deviation visualization program 202 to show deviations for oil production for one or more wells, but show deviations of water production of other wells. Moreover, the deviation values are not limited to fluids extracted from the ground, and may also include deviations from planned values regarding injection of secondary recovery fluid, such as water or carbon dioxide.

In the illustrative case of deviations from planned for oil production discussed with respect to FIG. 4, the units for the illustrative values were in thousands of standard barrels of oil; however, any suitable unit base may be used depending on the type of deviation value shown (e.g., for natural gas, the units may be thousands of standard cubic feet).

Moreover, the illustrative annuli show visually depicting deviation values for yearly, monthly, and daily deviations; however, different time periods may be used. For example, in some cases yearly, quarterly, and monthly deviation values may be of interest to the reservoir and/or production engineer. Moreover, the time frames need not necessarily align with the calendar year. For example, the yearly deviations could be the calendar year, or a rolling one year time frame, or a fiscal year.

In some cases, the deviation values may be based on real-time data—that is, data read from sensors or transmitters within the last minute. Thus, as a reservoir and/or production engineer views the illustrative window 300, the deviation values may change with each update to the underlying parameters. In other cases, only the daily deviation values are based on real-time data (e.g., the change in a production value of the last minute will have very little affected on a yearly production deviation). In other words, some deviation values may be based solely on historic values, and will not use real-time data.

The illustrative overhead view of FIG. 3 shows graphical images associated with hydrocarbon wells; however, the same style graphical image may be created to show field-wide deviations from planned production parameters. In this way, the reservoir and/or production engineer may visualize the state of the field, as well as which individual hydrocarbon wells are contributing to any long or short time field-level trend.

Having various deviation values for each hydrocarbon well provides a mechanism for a reservoir or production engineer to distinguish short term effects and events (related to specific flow conditions, in some cases not associated with the health of the hydrocarbon well) from longer term effects and events (which may relate to problems associated with downhole equipment and/or sand face production performance). For example, daily deviations (which may be referred to as losses and gains) for each well may be useful in identifying a well requiring an action. Field-wide daily deviations may be useful for planned or budget purposes. Monthly deviations for each well and/or across an entire field may be useful in identifying medium-short term trends for production performance analysis. Likewise, yearly deviations for each well and/or across an entire field may be useful in identifying long term trends for production performance analysis.

Figure 5:
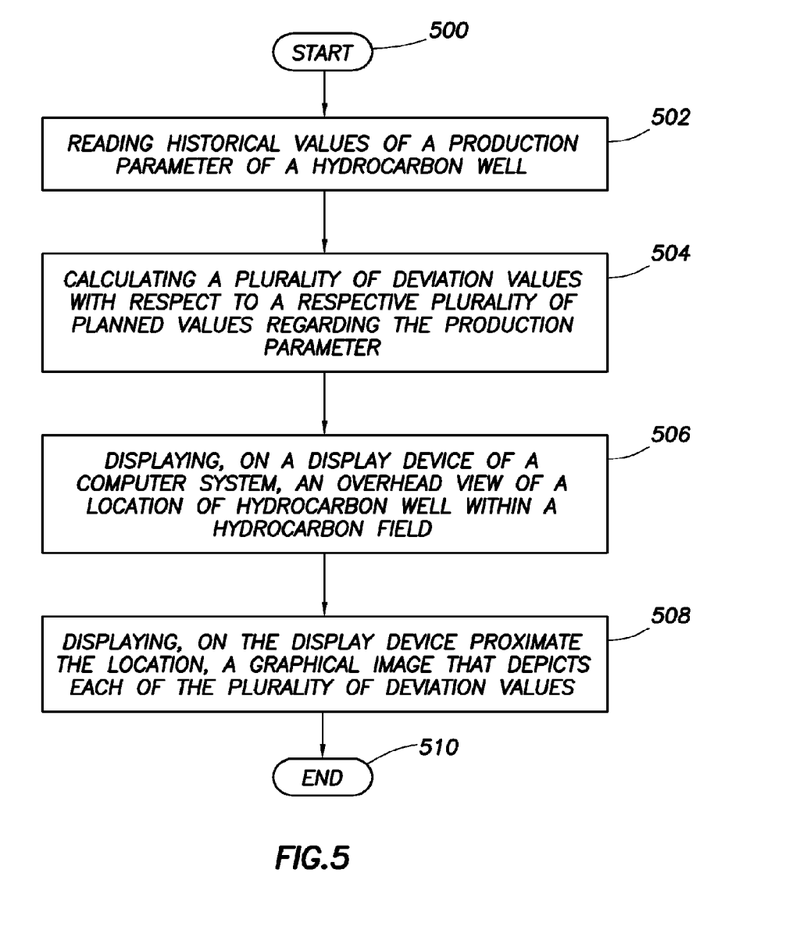
FIG. 5 shows a method in accordance with at least some embodiments.

FIG. 5 shows a method in accordance with at least some embodiments. In particular, the method starts (block 500) and includes: reading historical values of a production parameter of a hydrocarbon well (block 502); calculating a plurality of deviation values with respect to a respective plurality of planned values regarding the production parameter (block 504); displaying, on a display device of a computer system, an overhead view of a location of the hydrocarbon well within a hydrocarbon field (block 506); and displaying, on the display device proximate the location, a graphical image that depicts each of the plurality of deviation values (block 508). Thereafter, the method ends (block 510).

Figure 6:
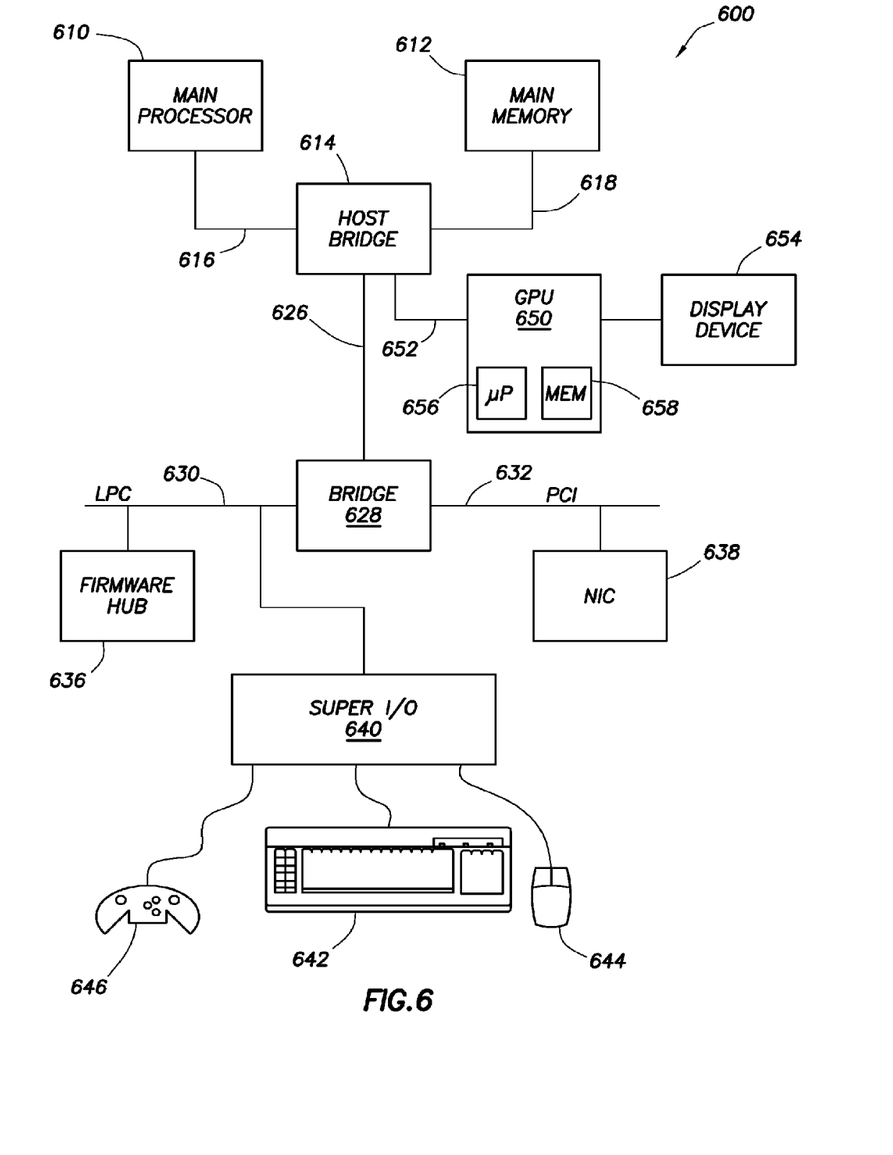
FIG. 6 shows a block diagram of a computer system in accordance with at least some embodiments.

FIG. 6 illustrates a computer system 600 in accordance with at least some embodiments. Any or all of the embodiments that involve predicting values of future hydrocarbon production, displaying predicted future hydrocarbon production, displaying correlations between injection wells and hydrocarbon wells, and/or displaying of user interfaces may be implemented in whole or in part on a computer system such as that shown in FIG. 6, or after-developed computer systems. In particular, computer system 600 comprises a main processor 610 coupled to a main memory array 612, and various other peripheral computer system components, through integrated host bridge 614. The main processor 610 may be a single processor core device, or a processor implementing multiple processor cores. Furthermore, computer system 600 may implement multiple main processors 610. The main processor 610 couples to the host bridge 614 by way of a host bus 616, or the host bridge 614 may be integrated into the main processor 610. Thus, the computer system 600 may implement other bus configurations or bus-bridges in addition to, or in place of, those shown in FIG. 6.

The main memory 612 couples to the host bridge 614 through a memory bus 618. Thus, the host bridge 614 comprises a memory control unit that controls transactions to the main memory 612 by asserting control signals for memory accesses. In other embodiments, the main processor 610 directly implements a memory control unit, and the main memory 612 may couple directly to the main processor 610. The main memory 612 functions as the working memory for the main processor 610 and comprises a memory device or array of memory devices in which programs, instructions and data are stored. The main memory 612 may comprise any suitable type of memory such as dynamic random access memory (DRAM) or any of the various types of DRAM devices such as synchronous DRAM (SDRAM), extended data output DRAM (EDODRAM), or Rambus DRAM (RDRAM). The main memory 612 is an example of a non-transitory computer-readable medium storing programs and instructions, and other examples are disk drives and flash memory devices.

The illustrative computer system 600 also comprises a second bridge 628 that bridges the primary expansion bus 626 to various secondary expansion buses, such as a low pin count (LPC) bus 630 and peripheral components interconnect (PCI) bus 632. Various other secondary expansion buses may be supported by the bridge device 628.

Firmware hub 636 couples to the bridge device 628 by way of the LPC bus 630. The firmware hub 636 comprises read-only memory (ROM) which contains software programs executable by the main processor 610. The software programs comprise programs executed during and just after power on self test (POST) procedures as well as memory reference code. The POST procedures and memory reference code perform various functions within the computer system before control of the computer system is turned over to the operating system. The computer system 600 further comprises a network interface card (NIC) 638 illustratively coupled to the PCI bus 632. The NIC 638 acts to couple the computer system 600 to a communication network, such the Internet, or local- or wide-area networks.

Still referring to FIG. 6, computer system 600 may further comprise a super input/output (I/O) controller 640 coupled to the bridge 628 by way of the LPC bus 630. The Super I/O controller 640 controls many computer system functions, for example interfacing with various input and output devices such as a keyboard 642, a pointing device 644 (e.g., mouse), a pointing device in the form of a game controller 646, various serial ports, floppy drives and disk drives. The super I/O controller 640 is often referred to as "super" because of the many I/O functions it performs.

The computer system 600 may further comprise a graphics processing unit (GPU) 650 coupled to the host bridge 614 by way of bus 652, such as a PCI Express (PCI-E) bus or Advanced Graphics Processing (AGP) bus. Other bus systems, including after-developed bus systems, may be equivalently used. Moreover, the graphics processing unit 650 may alternatively couple to the primary expansion bus 626, or one of the secondary expansion buses (e.g., PCI bus 632). The graphics processing unit 650 couples to a display device 654 which may comprise any suitable electronic display device upon which any image or text can be plotted and/or displayed. The graphics processing unit 650 may comprise an onboard processor 656, as well as onboard memory 658. The processor 656 may thus perform graphics processing, as commanded by the main processor 610. Moreover, the memory 658 may be significant, on the order of several hundred megabytes or more. Thus, once commanded by the main processor 610, the graphics processing unit 650 may perform significant calculations regarding graphics to be displayed on the display device, and ultimately display such graphics, without further input or assistance of the main processor 610.

In the specification and claims, certain components may be described in terms of algorithms and/or steps performed by a software application that may be provided on a non-transitory storage medium (i.e., other than a carrier wave or a signal propagating along a conductor). The various embodiments also relate to a system for performing various steps and operations as described herein. This system may be a specially-constructed device such as an electronic device, or it may include one or more general-purpose computers that can follow software instructions to perform the steps described herein. Multiple computers can be networked to perform such functions. Software instructions may be stored in any computer readable storage medium, such as for example, magnetic or optical disks, cards, memory, and the like.

At least some of the example embodiments are methods comprising: reading historical values of a production parameter of a hydrocarbon well; calculating a plurality of deviation values with respect to a respective plurality of planned values regarding the production parameter; displaying, on a display device of a computer system, an overhead view of a location of the hydrocarbon well within a hydrocarbon field; and displaying, on the display device proximate the location, a graphical image that depicts each of the plurality of deviation values.

The example methods may further comprise the graphical image fully enclosing the location of the hydrocarbon well. The graphical image may further comprise displaying an annulus, and wherein the location of the hydrocarbon well resides in the aperture of the annulus.

The displaying the graphical image may further comprise an annulus at the location of the hydrocarbon well, where a first portion of the annulus depicts a first deviation of the plurality of deviation values, a second portion of the annulus depicts a second deviation of the plurality of deviation values, and a third portion of the annulus depicts a third deviation of the plurality of deviation values. Each of the first portion, second portion, and third portion may delineate a status of the respective deviation as at least one selected from the group consisting of: above a planned value; and below a planned value. The displaying the graphical image may further comprise displaying the annulus such that circumferential lengths of each of the first portion, second portion, and third portions are unrelated to their respective deviation values. The delineating may further comprise delineating with a color. The displaying the graphical image may further comprise displaying the annulus such that circumferential lengths of each of the first portion, second portion, and third portions are unrelated to their respective deviation values.

The example method may further comprise: wherein calculating further comprises calculating a first deviation being a deviation of the production parameter to a planned value over a year, a second deviation value being a deviation of the production parameter to a planned value over a month, and a third deviation value being a deviation of the production parameter to a planned value over a day; wherein displaying the graphical image further comprises displaying an indicia of the first deviation value, the second deviation value, and the third deviation value.

The example method may further comprise: wherein calculating further comprises calculating a first oil deviation value being a deviation of oil production to a planned oil production over a year, a second oil deviation value being a deviation of oil production to a planned oil production over a month, and a third oil deviation value being a deviation of oil production to a planned oil production over a day; wherein displaying the graphical image further comprises displaying an indicia of the first oil deviation value, the second oil deviation value, and the third oil deviation value.

The example method may further comprise: wherein calculating further comprises calculating a first gas deviation value being a deviation of gas production to a planned gas production over a year, a second gas deviation value being a deviation of gas production to a planned gas production over a month, and a third gas deviation value being a deviation of gas production to a planned gas production over a day; wherein displaying the graphical image further comprises displaying an indicia of the first gas deviation value, the second gas deviation value, and the third gas deviation value.

The example method may further comprise: wherein calculating further comprises calculating a first water deviation value being a deviation of water production to a planned water production over a year, a second water deviation value being a deviation of water production to a planned water production over a month, and a third water deviation value being a deviation of water production to a planned water production over a day; wherein displaying the graphical image further comprises displaying an indicia of the first water deviation value, the second water deviation value, and the third water deviation value.

Other example embodiments are computer-readable mediums storing programs that, when executed, cause a processor to: display an overhead view a location of a first hydrocarbon well within a hydrocarbon field; display on the overhead view a location of a second hydrocarbon well within a hydrocarbon field, the second hydrocarbon well distinct from the first hydrocarbon well; calculate a first plurality of deviation values with respect to a respective plurality of planned values regarding the first hydrocarbon well; calculate a second plurality of deviation values with respect to a respective plurality of planned values regarding the second hydrocarbon well; display a first graphical image proximate to the first hydrocarbon well, the first graphical image depicts each of the first plurality of deviation values; and simultaneously display a second graphical image proximate to the second hydrocarbon well, the second graphical image depicts each of the second plurality of deviation values.

Other example computer-readable mediums may further comprise: wherein when the processor displays the first graphical image, the program causes the processor to display the first graphical image that fully encloses the location of the first hydrocarbon well; and wherein when the processor displays the second graphical image, the program causes the processor to display the second graphical image that fully encloses the location of the second hydrocarbon well.

Other example computer-readable mediums may further comprise: wherein when the processor displays the first graphical image, the program causes the processor to display a first annulus at the location of the first hydrocarbon well; and wherein when the processor displays the second graphical image, the program causes the processor to display a second annulus at the location of the second hydrocarbon well.

Other example computer-readable mediums may further comprise: wherein when the processor calculates the first plurality of deviation values, the program causes the processor to calculate a yearly deviation, a monthly deviation, and a daily deviation; and wherein when the processor calculates the second plurality of deviation values, the program causes the processor to calculate a yearly deviation, a monthly deviation, and a daily deviation.

With respect to displaying, other example computer-readable mediums may cause the processor to: display the each graphical image with features indicative of each deviation value's status as one of above or below the respective planned value; or display the features comprising a color.

Other example computer-readable mediums may further comprise: wherein when the processor calculates the first plurality of deviation values, the program causes the processor to calculate a deviation of oil production to a planned oil production over a year, a deviation of oil production to a planned oil production over a month, and a deviation of oil production to a planned oil production over a day; and wherein when the processor calculates the second plurality of deviation values, the program causes the processor to calculate a deviation of oil production to a planned oil production over a year, a deviation of oil production to a planned oil production over a month, and a deviation of oil production to a planned oil production over a day.

Other example computer-readable mediums may further comprise: wherein when the processor calculates the first plurality of deviation values, the program causes the processor to calculate a deviation of gas production to a planned gas production over a year, a deviation of gas production to a planned gas production over a month, and a deviation of gas production to a planned gas production over a day; and wherein when the processor calculates the second plurality of deviation values, the program causes the processor to calculate a deviation of gas production to a planned gas production over a year, a deviation of gas production to a planned gas production over a month, and a deviation of gas production to a planned gas production over a day.

Other example computer-readable mediums may further comprise: wherein when the processor calculates the first plurality of deviation values, the program causes the processor to calculate a deviation of water production to a planned water production over a year, a deviation of water production to a planned water production over a month, and a deviation of water production to a planned water production over a day; and wherein when the processor calculates the second plurality of deviation values, the program causes the processor to calculate a deviation of water production to a planned water production over a year, a deviation of water production to a planned water production over a month, and a deviation of water production to a planned water production over a day.

Other example embodiments are systems comprising: a processor; a memory coupled to the processor; and a display device coupled to the processor. The memory stores a program that, when executed by the processor, causes the processor to: read historical values of a production parameter of a hydrocarbon well; calculate a plurality of deviation values with respect to a respective plurality of planned values regarding the production parameter; display, on the display device, an overhead view of a location of the hydrocarbon well within a hydrocarbon field; and displaying, on the display device proximate the location, a graphical image that depicts each of the plurality of deviation values.

In other example systems: when the processor calculates, the program causes the processor to calculate a first deviation being a deviation of the production parameter to a planned value over a year, a second deviation value being a deviation of the production parameter to a planned value over a month, and a third deviation value being a deviation of the production parameter to a planned value over a day; and when the processor displays the graphical image, the program causes the processor to display an indicia of the first deviation value, the second deviation value, and the third deviation value.

With respect to displaying, in other example systems the program causes the processor to delineate with a feature of the graphical image an indication of each deviation value's status as one of above or below the respective plurality of planned values. The program further causes the processor to delineate with a color.

In other example systems: when the processor calculates, the program further causes the processor to calculate a first oil deviation value being a deviation of oil production to a planned oil production over a year, a second oil deviation value being a deviation of oil production to a planned oil production over a month, and a third oil deviation value being a deviation of oil production to a planned oil production over a day; and when the processor displays the graphical image, the program further causes the processor to display an indicia of the first oil deviation value, the second oil deviation value, and the third oil deviation value.

In other example systems: when the processor calculates, the program further causes the processor to calculate a first gas deviation value being a deviation of gas production to a planned gas production over a year, a second gas deviation value being a deviation of gas production to a planned gas production over a month, and a third gas deviation value being a deviation of gas production to a planned gas production over a day; and when the processor displays the graphical image, the program further causes the processor to display an indicia of the first gas deviation value, the second gas deviation value, and the third gas deviation value.

In other example systems: when the processor calculates, the program further causes the processor to calculate a first water deviation value being a deviation of water production to a planned water production over a year, a second water deviation value being a deviation of water production to a planned water production over a month, and a third water deviation value being a deviation of water production to a planned water production over a day; and when the processor displays the graphical image, the program further causes the processor to display an indicia of the first water deviation value, the second water deviation value, and the third water deviation value.

References to "one embodiment", "an embodiment", "a particular embodiment" indicate that a particular element or characteristic is included in at least one embodiment of the invention. Although the phrases "in one embodiment", "an embodiment", and "a particular embodiment" may appear in various places, these do not necessarily refer to the same embodiment.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments and/or to create a non-transitory computer-readable media (i.e., not a carrier wave) that stores a software program to implement the method aspects of the various embodiments.

The above discussion is meant to be illustrative of the principles and various embodiments of the present invention. Numerous variations and modifications will become apparent to those skilled in the art once the above disclosure is fully appreciated. For example, the graphical image showing the deviations values may take any suitable form, such as a polygon (e.g., a triangle), with different segments of the polygon associated with deviation values over different time periods. It is intended that the following claims be interpreted to embrace all such variations and modifications.

What is claimed is:

1. A method comprising:
   obtaining values of a production parameter measured over different time periods for a hydrocarbon well located within a hydrocarbon field;
   calculating a plurality of deviation values of the production parameter of the hydrocarbon well for the different time periods based on a deviation of each of the measured values relative to a corresponding one of a plurality of planned values of the production parameter for each of the different time periods; and
   displaying, on a display device of a computer system, an overhead view of the hydrocarbon field with a graphical image indicating a location of the hydrocarbon well within the hydrocarbon field and the respective plurality of deviation values of the production parameter of the hydrocarbon well for the different time periods,
   wherein the graphical image comprises an annulus, the location of the hydrocarbon well is indicated by an aperture of the annulus, and a relative magnitude of the respective plurality of deviation values of the production parameter for the different time periods are indicated by different portions of the annulus surrounding the aperture.

2. The method of claim 1, wherein a first portion of the annulus depicts a first of the plurality of deviation values over a first of the plurality of time periods, a second portion of the annulus depicts a second of the plurality of deviation values over a second of the plurality of time periods, and a third portion of the annulus depicts a third of the plurality of deviation values over a third of the plurality of time periods.

3. The method of claim 2, wherein each of the first, second, and third portions of the annulus indicates a status of the production parameter of the hydrocarbon well as being at least one of a first status indicating that the production parameter is above a corresponding planned value or a second status indicating that the production parameter is below the corresponding planned value.

4. The method of claim 3, wherein the status of the production parameter of the hydrocarbon well is indicated using different colors corresponding to the first status and the second status.

5. The method of claim 2, wherein displaying the graphical image further comprises displaying the annulus such that circumferential lengths of each of the first, second, and third portions are unrelated to their respective first, second, and third deviation values.

6. The method of claim 1:
   wherein calculating further comprises calculating a first deviation of the production parameter relative to a planned value over a year, a second deviation of the production parameter relative to a planned value over a month, and a third deviation of the production parameter relative to a planned value over a day; and
   wherein displaying the graphical image further comprises displaying the graphical image with an indicia of the first deviation of the production parameter for the year, the second deviation of the production parameter for the month, and the third deviation of the production parameter for the day.

7. The method of claim 6, wherein:
   the production parameter is the hydrocarbon well's oil production over the different time periods;
   calculating the respective first, second and third deviations of the production parameter comprises calculating a first deviation of the oil production of the hydrocarbon well relative to a planned oil production over a year, a second deviation of the oil production relative to a planned oil production over a month, and a third deviation of the oil production relative to a planned oil production over a day; and
   displaying the graphical image further comprises displaying the graphical image with an indicia of the first deviation of the oil production for the year, the second deviation of the oil production for the month, and the third deviation of the oil production for the day.

8. The method of claim 6, wherein:
   the production parameter is the hydrocarbon well's gas production over the different time periods;
   calculating the respective first, second and third deviation values comprises calculating a first deviation of the gas production of the hydrocarbon well relative to a planned gas production over a year, a second deviation of the gas production relative to a planned gas production over a month, and a third deviation of the gas production relative to a planned gas production over a day; and
   displaying the graphical image further comprises displaying the graphical image with an indicia of the first deviation of the gas production for the year, the second deviation of the gas production for the month, and the third deviation of the gas production for the day.

9. The method of claim 6, wherein:
the production parameter is the hydrocarbon well's water production over the different time periods;
calculating the respective first, second and third deviation values comprises calculating a first deviation of the water production of the hydrocarbon well relative to a planned water production over a year, a second deviation of the water production relative to a planned water production over a month, and a third deviation of the water production relative to a planned water production over a day; and
displaying the graphical image further comprises displaying the graphical image with an indicia of the first deviation of the water production for the year, the second deviation of the water production for the month, and the third deviation of the water production for the day.

10. The method of claim 6, wherein:
obtaining further comprises obtaining measured values of the production parameter for the hydrocarbon well in real-time;
calculating further comprises recalculating the third deviation of the production parameter relative to the planned value over the day in response to the measured values of the production parameter that are obtained for the hydrocarbon well in real-time; and
displaying further comprises updating the displayed graphical image for the hydrocarbon well within the overhead view of the hydrocarbon field based on the recalculated third deviation of the production parameter for the day.

11. A non-transitory computer-readable medium storing a program that, when executed by a processor, causes the processor to:
obtain values of a first production parameter measured over different time periods for a first hydrocarbon well located within a hydrocarbon field;
obtain values of a second production parameter measured over the different time periods for a second hydrocarbon well located within the hydrocarbon field;
calculate a first plurality of deviation values of the first production parameter of the first hydrocarbon well for the different time periods based on a deviation of each of the measured values of the first production parameter relative to a corresponding one of a plurality of planned values of the first production parameter for each of the different time periods;
calculate a second plurality of deviation values of the second production parameter of the second hydrocarbon well based on a deviation of each of the measured values of the second production parameter relative to a corresponding one of a plurality of planned values of the second production parameter for each of the different time periods; and
display an overhead view of the hydrocarbon field with a first graphical image for the first hydrocarbon well and a second graphical image for the second hydrocarbon well, the first graphical image indicating a location of the first hydrocarbon well and the respective first plurality of deviation values of the first production parameter for the different time periods, and the second graphical image indicating a location of the second hydrocarbon well and the respective second plurality of deviation values of the second production parameter for the different time periods,
wherein the first graphical image includes a first annulus, the location of the first hydrocarbon well is indicated by an aperture of the first annulus, and a relative magnitude of the respective first plurality of deviation values for the different time periods are indicated by different portions of the first annulus surrounding the aperture of the first annulus, and
wherein the second graphical image includes a second annulus, the location of the second hydrocarbon well is indicated by an aperture of the second annulus, and a relative magnitude of the respective second plurality of deviation values for the different time periods are indicated by different portions of the second annulus surrounding the aperture of the second annulus.

12. The non-transitory computer-readable medium of claim 11:
wherein when the processor calculates the first plurality of deviation values, the program causes the processor to calculate a yearly deviation, a monthly deviation, and a daily deviation; and
wherein when the processor calculates the second plurality of deviation values, the program causes the processor to calculate a yearly deviation, a monthly deviation, and a daily deviation.

13. The non-transitory computer-readable medium of claim 11, wherein when the processor displays the first and second graphical images, the program further causes the processor to display each of the first and second graphical images with features indicative of a status of each of the respective first and second plurality of deviation values as one of above or below a planned value for the respective first and second production parameters of the first and second hydrocarbon wells.

14. The non-transitory computer readable medium of claim 13, wherein the status of each of the respective first and second plurality of deviation values is indicated by a corresponding color.

15. The non-transitory computer-readable medium of claim 11:
wherein when the processor calculates the first plurality of deviation values, the program causes the processor to calculate a deviation of oil production to a planned oil production over a year, a deviation of oil production to a planned oil production over a month, and a deviation of oil production to a planned oil production over a day; and
wherein when the processor calculates the second plurality of deviation values, the program causes the processor to calculate a deviation of oil production to a planned oil production over a year, a deviation of oil production to a planned oil production over a month, and a deviation of oil production to a planned oil production over a day.

16. The non-transitory computer-readable medium of claim 11:
wherein when the processor calculates the first plurality of deviation values, the program causes the processor to calculate a deviation of gas production to a planned gas production over a year, a deviation of gas production to a planned gas production over a month, and a deviation of gas production to a planned gas production over a day; and
wherein when the processor calculates the second plurality of deviation values, the program causes the processor to calculate a deviation of gas production to a planned gas production over a year, a deviation of gas production to a planned gas production over a month, and a deviation of gas production to a planned gas production over a day.

17. The non-transitory computer-readable medium of claim 11:

wherein when the processor calculates the first plurality of deviation values, the program causes the processor to calculate a deviation of water production to a planned water production over a year, a deviation of water production to a planned water production over a month, and a deviation of water production to a planned water production over a day; and wherein when the processor calculates the second plurality of deviation values, the program causes the processor to calculate a deviation of water production to a planned water production over a year, a deviation of water production to a planned water production over a month, and a deviation of water production to a planned water production over a day.

18. The non-transitory computer-readable medium of claim 11, wherein the first production parameter of the first hydrocarbon well is different than the second production parameter of the second hydrocarbon well.

19. A system comprising:
a processor;
a display device coupled to the processor; and
a memory coupled to the processor, the memory storing a program that, when executed by the processor, causes the processor to perform a plurality of functions, including functions to:
obtain values of a production parameter measured over different time periods for a hydrocarbon well located within a hydrocarbon field;
calculate a plurality of deviation values of the production parameter of the hydrocarbon well based on a deviation of each of the measured values relative to a corresponding one of a plurality of planned values of the production parameter for each of the different time periods; and
display, on the display device, an overhead view of the hydrocarbon field with a graphical image indicating a location of the hydrocarbon well within the hydrocarbon field and the respective plurality of deviation values of the production parameter of the hydrocarbon well for the different time periods, wherein the graphical image comprises an annulus, the location of the hydrocarbon well is indicated by an aperture of the annulus, and a relative magnitude of the respective plurality of deviation values of the production parameter for the different time periods are indicated by different portions of the annulus surrounding the aperture.

20. The system of claim 19:
wherein when the processor calculates, the program causes the processor to calculate a first deviation value being a deviation of the production parameter to a planned value over a year, a second deviation value being a deviation of the production parameter to a planned value over a month, and a third deviation value being a deviation of the production parameter to a planned value over a day;

wherein when the processor displays the graphical image, the program causes the processor to display an indicia of the first deviation value, the second deviation value, and the third deviation value.

21. The system of claim 19 wherein when the processor displays the graphical image, the program causes the processor to delineate with a feature of the graphical image an indication of each deviation value's status as one of above or below the respective plurality of planned values.

22. The system of claim 21 wherein when the processor delineates, the program further causes the processor to delineate with a color.

23. The system of claim 19:
wherein when the processor calculates, the program further causes the processor to calculate a first oil deviation value being a deviation of oil production to a planned oil production over a year, a second oil deviation value being a deviation of oil production to a planned oil production over a month, and a third oil deviation value being a deviation of oil production to a planned oil production over a day;
wherein when the processor displays the graphical image, the program further causes the processor to display an indicia of the first oil deviation value, the second oil deviation value, and the third oil deviation value.

24. The system of claim 19:
wherein when the processor calculates, the program further causes the processor to calculate a first gas deviation value being a deviation of gas production to a planned gas production over a year, a second gas deviation value being a deviation of gas production to a planned gas production over a month, and a third gas deviation value being a deviation of gas production to a planned gas production over a day;
wherein when the processor displays the graphical image, the program further causes the processor to display an indicia of the first gas deviation value, the second gas deviation value, and the third gas deviation value.

25. The system of claim 19:
wherein when the processor calculates, the program further causes the processor to calculate a first water deviation value being a deviation of water production to a planned water production over a year, a second water deviation value being a deviation of water production to a planned water production over a month, and a third water deviation value being a deviation of water production to a planned water production over a day;
wherein when the processor displays the graphical image, the program further causes the processor to display an indicia of the first water deviation value, the second water deviation value, and the third water deviation value.

* * * * *